United States Patent
Rhee (10) Patent No.: US 6,362,656 B2
(45) Date of Patent: *Mar. 26, 2002

(54) INTEGRATED CIRCUIT MEMORY DEVICES HAVING PROGRAMMABLE OUTPUT DRIVER CIRCUITS THEREIN

(75) Inventor: Sang-jae Rhee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 09/753,927

(22) Filed: Jan. 3, 2001

Related U.S. Application Data (63) Continuation of application No. 09/105,394, filed on Jun. 26, 1998.

(30) Foreign Application Priority Data

Jun. 27, 1997 (KR) ............................................. 97-28114
Dec. 30, 1997 (KR) ............................................. 97-77760

(51) Int. Cl.[7] ......................................... H03K 19/0175
(52) U.S. Cl. ............................. 326/87; 326/86; 326/82
(58) Field of Search ............................. 326/82, 83, 86, 326/87

(56) References Cited

U.S. PATENT DOCUMENTS

| | | | |
|---|---|---|---|
| 4,972,100 A | 11/1990 | Lim et al. ................... | 307/443 |
| 5,134,311 A | * 7/1992 | Biber et al. ................. | 307/270 |
| 5,153,450 A | 10/1992 | Ruetz ........................ | 307/443 |
| 5,220,216 A | 6/1993 | Woo ........................... | 307/469 |
| 5,227,679 A | 7/1993 | Woo ........................... | 307/469 |
| 5,319,258 A | 6/1994 | Ruetz ........................ | 307/443 |
| 5,355,171 A | 10/1994 | Miyazaki et al. ........... | 348/505 |
| 5,361,003 A | 11/1994 | Roberts ....................... | 326/21 |
| 5,397,942 A | 3/1995 | Yamada ...................... | 326/82 |
| 5,617,040 A | 4/1997 | Matthews ................... | 326/38 |
| 5,666,078 A | 9/1997 | Lamphier et al. .......... | 327/108 |
| 5,677,555 A | 10/1997 | Kalpakjian et al. ......... | 257/206 |
| 5,701,072 A | 12/1997 | Jeon et al. .................. | 323/212 |
| 5,705,941 A | 1/1998 | Fukazawa et al. .......... | 326/86 |
| 5,719,491 A | 2/1998 | Kolanko et al. ............. | 323/303 |
| 5,732,027 A | 3/1998 | Arcoleo et al. ........ | 365/189.05 |
| 5,742,832 A | 4/1998 | Buxton et al. .............. | 395/750 |
| 5,900,744 A | 5/1999 | Bisen et al. ................. | 326/58 |

FOREIGN PATENT DOCUMENTS

EP 0253914 A1 1/1988

OTHER PUBLICATIONS

Search Report, GB 9827722.1, May 19, 1999.

* cited by examiner

Primary Examiner—Michael Tokar
Assistant Examiner—Ahn Tran
(74) Attorney, Agent, or Firm—Myers Bigel Sibley & Sajovec (57) ABSTRACT

Output drivers preferably contain a plurality of driver circuits therein that are commonly connected to an output line to be driven and can be selectively enabled or disabled to increase or decrease drive capability, respectively. Driver circuits may include first and second control signal lines (e.g., MRS1, MRS2), a first pull-up/pull-down driver circuit having first and second data inputs, a first control input electrically coupled to the first control signal line (e.g., MRS1) and a second control input, and a second pull-up/pull-down driver circuit having first and second data inputs electrically coupled to the first and second data inputs of the first pull-up/pull-down driver circuit, respectively, a first control input electrically coupled to the second control signal line (e.g., MRS2) and a second control input. First and second complementary control signals lines (e.g., MRS1, MRS2) are also preferably provided and the second control inputs of the first pull-up/pull-down driver circuit and second pull-up/pull-down driver circuit are electrically coupled to the first and second complementary control signal lines, respectively. These control signal lines and complementary control signal lines can be used to control the number of driver circuits that are active within the output driver, based on loading conditions.

19 Claims, 7 Drawing Sheets

INTEGRATED CIRCUIT MEMORY DEVICES HAVING PROGRAMMABLE OUTPUT DRIVER CIRCUITS THEREIN

This application is a continuation of prior application Ser. No. 09/105,394, filed Jun. 26, 1998, the disclosure of which is hereby incorporated herein by reference.

FIELD OF THE INVENTION

The present invention relates to integrated circuit devices, and more particularly to integrated circuit devices having output driver circuits therein.

BACKGROUND OF THE INVENTION

Figure 1:
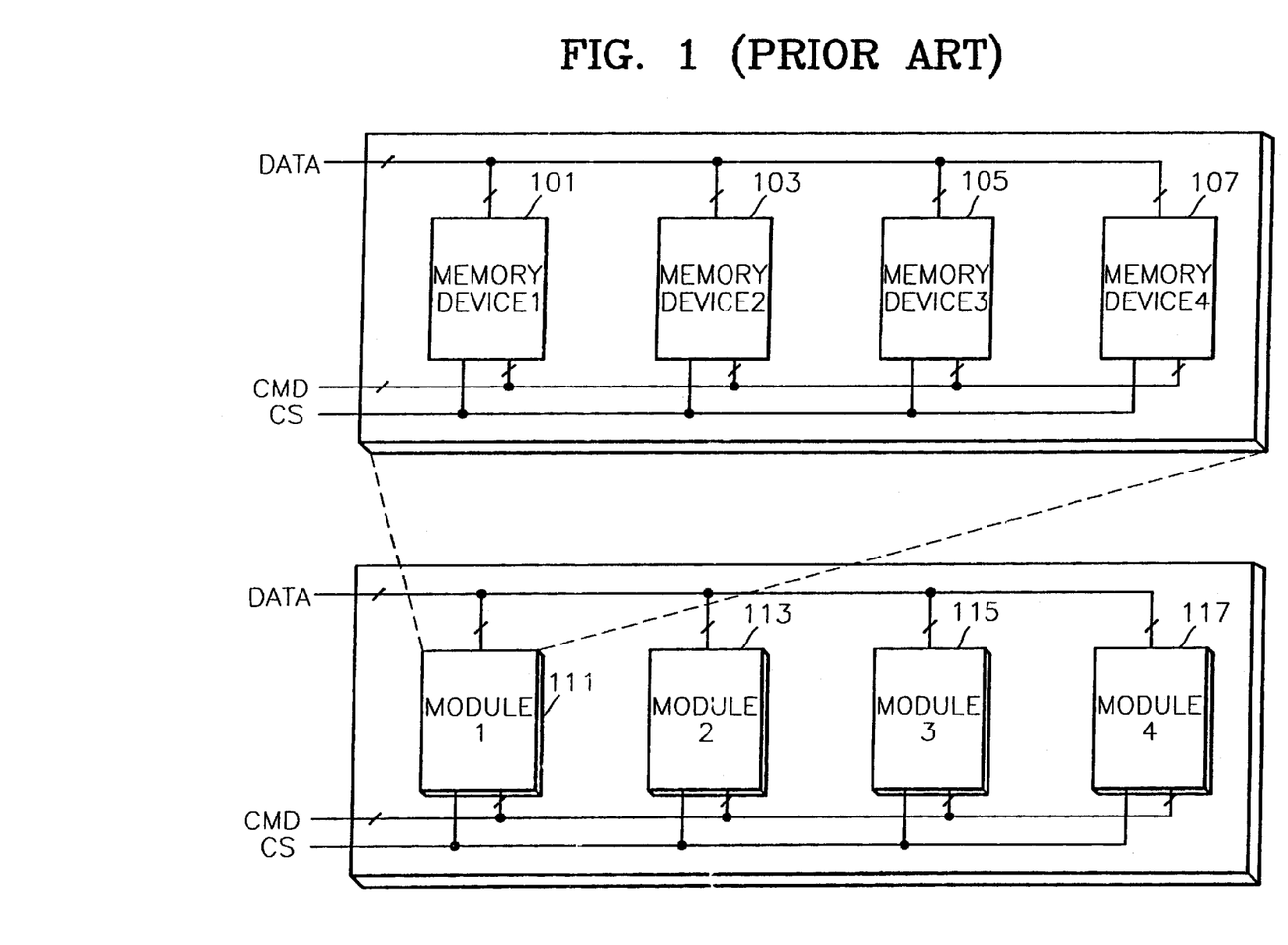
FIG. 1 is a block diagram of a system board containing a memory module array therein, according to the prior art.

Integrated circuit devices may contain specialized output driver circuits therein for driving external devices when the loads associated with the external devices are appreciable. Referring now to FIG. 1, an integrated circuit device may also be provided having a plurality of memory modules 111, 113, 115 and 117 therein which are electrically coupled to a data bus (DATA), a command bus (CMD) and a chip select (CS) signal line. Each memory module may itself be comprised of a plurality of memory devices 101, 103, 105 and 107. As will be understood by those skilled in the art, an increase in the number of memory modules on an integrated circuit system board may lead to unbalanced loading on the memory modules. Such unbalanced loading may be caused by the unequal lengths in the signal lines connected to the modules and may result in clock skew which limits high frequency performance.

Figure 2:
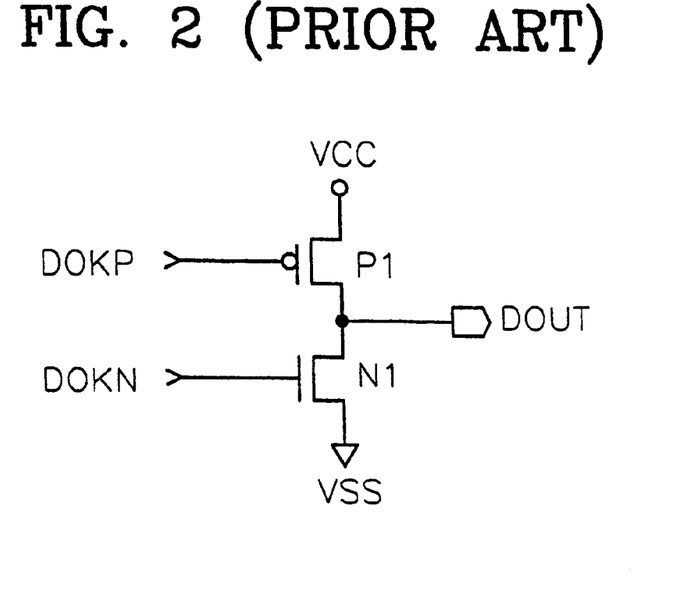
FIG. 2 is an electrical schematic of an output driver circuit according to the prior art.

FIG. 2 illustrates a conventional output driver circuit which comprises a PMOS pull-up transistor P1 and an NMOS pull-down transistor N1, connected as illustrated. As will be understood by those skilled in the art, application of logic 0 signals as DOKP and DOKN to the gates of the PMOS pull-up transistor P1 and NMOS pull-down transistor N1 will cause the output DOUT to be pulled to VCC. Similarly, application of logic 1 signals as DOKP and DOKN to the gates of the PMOS pull-up transistor P1 and NMOS pull-down transistor N1 will cause the output DOUT to be pulled to VSS. Finally, simultaneous application of a logic 1 signal as DOKP to the gate of the PMOS pull-up transistor P1 and a logic 0 signal as DOKN to the gate of the NMOS pull-down transistor N1 will cause the output DOUT to float in a high impedance state.

Figure 3:
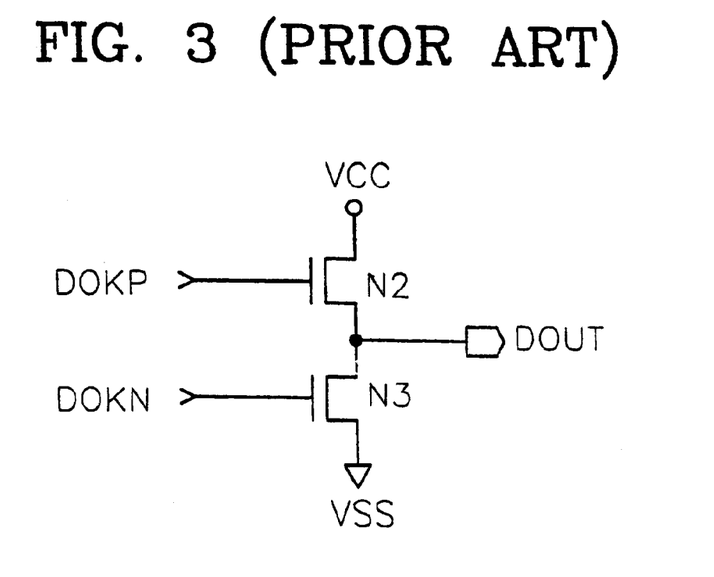
FIG. 3 is an electrical schematic of another output driver circuit according to the prior art.

FIG. 3 illustrates another conventional output driver circuit which comprises an NMOS pull-up transistor N2 and an NMOS pull-down transistor N3, connected as illustrated. As will be understood by those skilled in the art, application of logic 1 and logic 0 signals as DOKP and DOKN, respectively, will cause the output DOUT to be pulled to VCC. Similarly, application of logic 0 and logic 1 signals as DOKP and DOKN, respectively, will cause the output DOUT to be pulled to VSS. Finally, simultaneous application of logic 0 signals as DOKP and DOKN will cause the output DOUT to float in a high impedance state.

Unfortunately, the driving capability of the circuits of FIG. 2 and 3, which is a function of the sizes of the pull-up and pull-down transistors, is fixed and typically cannot be varied in response to dynamic or static variations in loading. Thus, notwithstanding these conventional driver circuits, there continues to be a need for improved driver circuits which account for variations in loading.

SUMMARY OF THE INVENTION

It is therefore an object of the present invention to provide improved driver circuits and integrated circuit devices containing improved driver circuits therein.

It is another object of the present invention to provide driver circuits which can account for variations in loading.

These and other objects, features and advantages of the present invention are provided by output drivers which contain a plurality of driver circuits therein that are commonly connected to an output line to be driven and can be selectively enabled or disabled to increase or decrease drive capability, respectively. Driver circuits according to an embodiment of the present invention include first and second control signal lines (e.g., MRS1, MRS2), a first pull-up/pull-down driver circuit having first and second data inputs, a first control input electrically coupled to the first control signal line (e.g., MRS1) and a second control input, and a second pull-up/pull-down driver circuit having first and second data inputs electrically coupled to the first and second data inputs of the first pull-up/pull-down driver circuit, respectively, a first control input electrically coupled to the second control signal line (e.g., MRS2) and a second control input. First and second complementary control signals lines (e.g., $\overline{MRS1}$, $\overline{MRS2}$) are also preferably provided and the second control inputs of the first pull-up/pull-down driver circuit and second pull-up/pull-down driver circuit are electrically coupled to the first and second complementary control signal lines, respectively. These control signal lines and complementary control signal lines can be used to control the number of driver circuits that are active within the output driver, based on loading conditions.

According to a preferred aspect of the present invention, the first and second pull-up/pull-down driver circuits each comprise first and second PMOS transistors and first and second NMOS transistors. In particular, the first and second NMOS transistors of the first pull-up/pull-down driver circuit have respective gate electrodes which correspond to the first data input and the first control input, respectively, and the first and second PMOS transistors of the first pull-up/pull-down driver circuit have respective gate electrodes which correspond to the second data input and the second control input, respectively. Alternatively, the plurality of pull-up/pull-down driver circuits may each comprise four MOS transistors of the same type electrically connected in series between first and second supply signal lines (e.g., VCC and VSS).

According to another aspect of the present invention, a pull-up/pull-down driver circuit is provided which is always active to provide a baseline level of drive capability. In particular, a third pull-up/pull-down driver circuit may be provided which comprises only a single pair of MOS transistors and has first and second data inputs electrically coupled to the first and second data inputs of the first pull-up/pull-down driver circuit, respectively.

In addition, a controller is preferably provided which generates a first pair of complementary control signals on the first control signal line and the first complementary control signal line and generates a second pair of complementary control signals on the second control signal line and the second complementary control signal line, in response to command signals and an address. If the preferred driver circuit is used in an integrated circuit memory device, a memory array may also be provided which is electrically coupled to a pair of differential data lines and a data buffer may be provided which has first and second inputs electrically coupled to the pair of differential data lines and first and second outputs electrically coupled to the first and second data inputs of the first pull-up/pull-down driver circuit.

DESCRIPTION OF PREFERRED EMBODIMENTS

The present invention will now be described in greater detail with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 4:
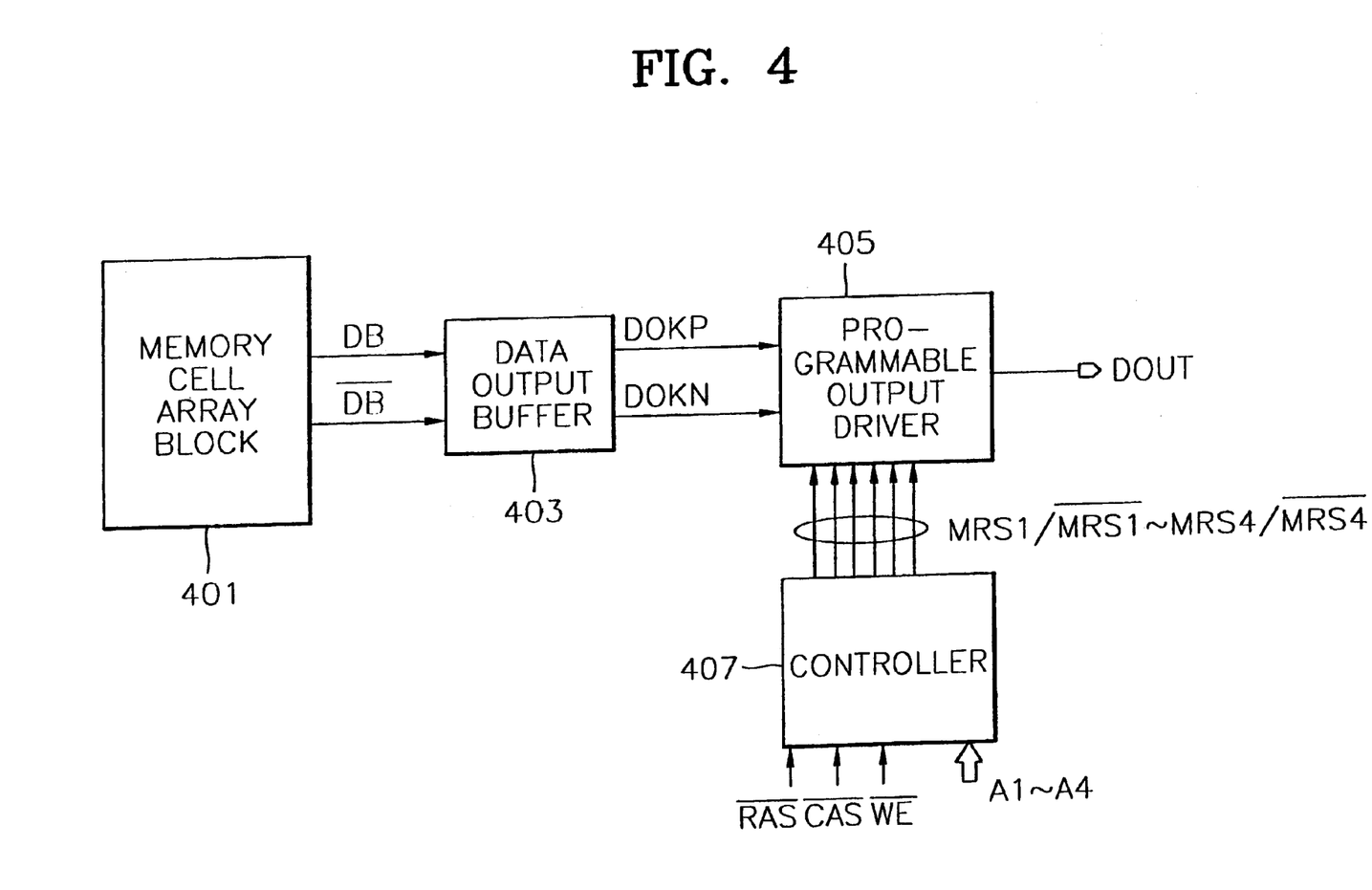
FIG. 4 is a block diagram of a preferred memory device according to an embodiment of the present invention.

Referring now to FIG. 4, a preferred memory device includes a memory cell array block 401, a data output buffer 403, a programmable output driver 405 (which is coupled to an output pad DOUT) and an output driver controller 407. The data output buffer 403 receives differential output data from the memory cell array block 401 via complementary data buses DB and $\overline{DB}$, and generates first and second output signals DOKP and DOKN. The programmable output driver 405 has a driving capability which can be varied in response to a plurality of control signals MRS1/$\overline{MRS1}$–MRS4/$\overline{MRS4}$ and in response to the first and second output signals DOKP and DOKN. The output driver controller 407 is also provided to generate the plurality of control signals MRS1/$\overline{MRS1}$–MRS4/$\overline{MRS4}$, in response to command signals (CMD) and address signals A1–A4. These command signals include a row address strobe signal $\overline{RAS}$, a column address strobe signal $\overline{CAS}$ and a write enable signal $\overline{WE}$.

In particular, the driving capability of the preferred output driver 405 can be programmed when the command signals $\overline{RAS}$, $\overline{CAS}$ and $\overline{WE}$ are properly activated, the addresses A1–A4 are applied and the plurality of control signals MRS1/$\overline{MRS1}$–MRS4/$\overline{MRS4}$ are generated. These control signals are generated at respective complementary levels based on the values of the addresses A1–A4, as described more fully hereinbelow with respect to FIGS. 7–8.

Accordingly, when a system board includes a plurality of modules and each module includes a plurality of semiconductor memory devices, as illustrated by FIG. 1, the size of the output driver for each memory device can be selectively programmed to account for different loading conditions associated with each device and module. Thus, the skew between signals generated by memory devices within modules at different positions within a system board can be efficiently reduced.

Figure 5:
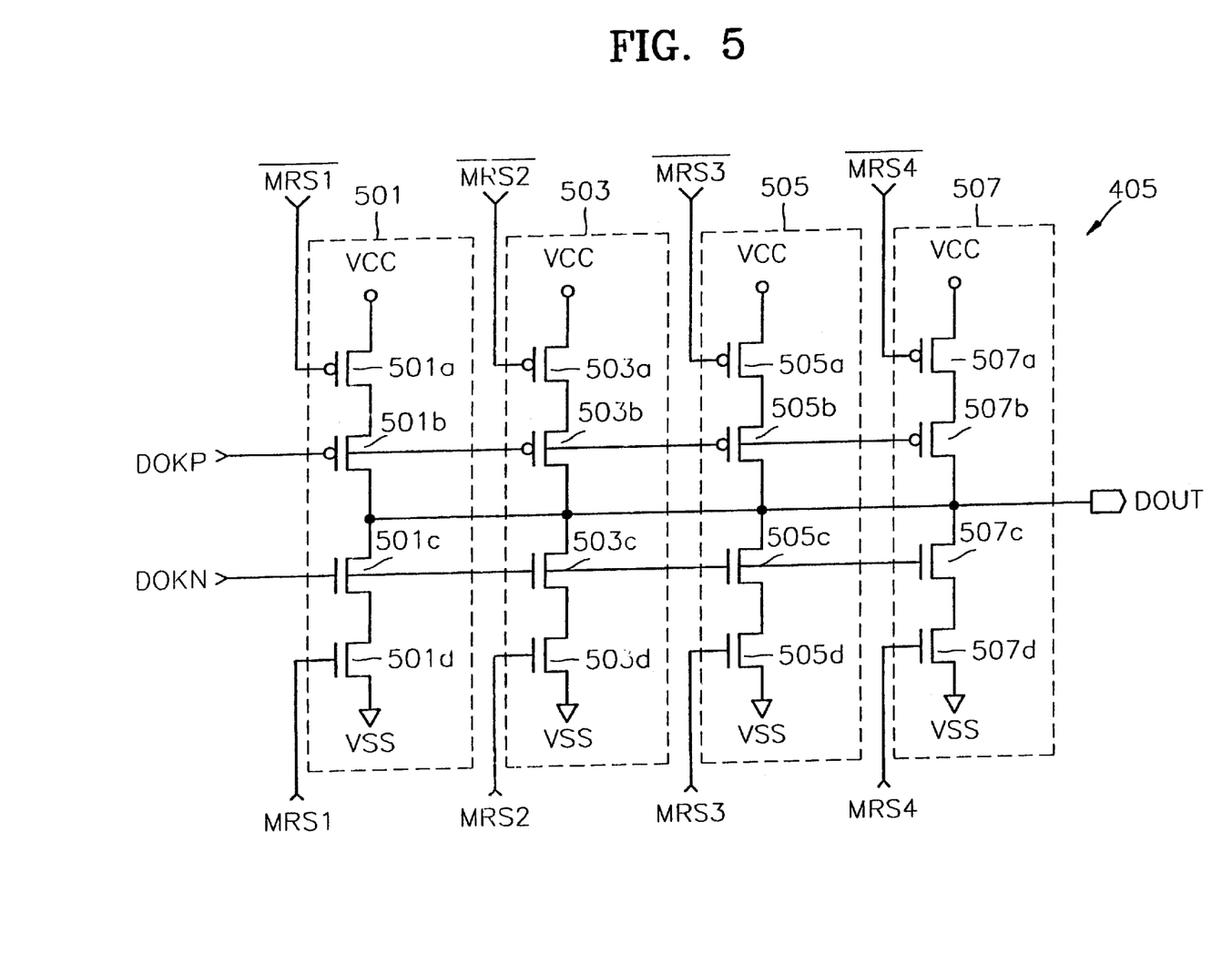
FIG. 5 is an electrical schematic of the programmable output driver of FIG. 4, according to a first embodiment of the present invention.

The structure and operation of preferred programmable output driver circuits 405 will now be described with reference to FIGS. 5–6. Referring specifically to FIG. 5, the programmable output driver circuit 405 according to a first embodiment includes four output driving units 501, 503, 505 and 507 for driving an output pad DOUT in response to first and second output signals DOKP and DOKN. Each of the output driving units 501, 503, 505 and 507 is independently controlled by corresponding control signals MRS1/$\overline{MRS1}$–MRS4/$\overline{MRS4}$. The number of programmable output driving units can be adjusted depending upon application. Each of the output driving units 501, 503, 505 and 507 includes: (i) PMOS switch transistors 501a, 503a, 505a and 507a (each of which has a source to which a power supply voltage VCC is applied and a gate to which a corresponding inverted control signal, one of $\overline{MRS1}$–$\overline{MRS4}$, is applied); (ii) PMOS pull-up transistors 501b, 503b, 505b and 507b (each of which has a source connected to a respective drain of a PMOS switch transistor, a gate to which the first output signal DOKP is applied and a drain connected to the pad DOUT); (iii) NMOS pull-down transistors 501c, 503c, 505c and 507c (each of which has a drain connected to the pad DOUT and a gate to which the second output signal DOKN is applied); and (iv) NMOS switch transistors 501d, 503d, 505d and 507d (each of which has a drain connected to source of a respective NMOS pull-down transistor, a gate to which a corresponding control signal, one of MRS1–MRS4, is applied and a source to which a ground voltage VSS is applied).

Based on this configuration of driving units, the effective size of the output driver 405 can be controlled by selectively turning on or off the PMOS switch transistors 501a, 503a, 505a and 507a (which are controlled by the inverted control signals $\overline{MRS1}$–$\overline{MRS4}$) and turning on or off the corresponding NMOS switch transistors 501d, 503d, 505d and 507d controlled by the control signals $\overline{MRS1}$–$\overline{MRS4}$. For example, when the control signals MRS1–MRS4 are set to (1,1,1,1), the PMOS switch transistors 501a, 503a, 505a and 507a and the NMOS switch transistors 501d, 503d, 505d and 507d of the output driving units 501, 503, 505 and 507 are all turned on. This means the driving units 501, 503, 505 and 507 all drive the output pad DOUT in parallel in response to the first and second output signals DOKP and DOKN. However, when the control signals MRS1–MRS4 are set to (0,0,0,1), the PMOS switch transistors 501a, 503a and 505a and the NMOS switch transistors 501d, 503d and 505d of the output driving units 501, 503 and 505 are turned off, and the PMOS switch transistor 507a and the NMOS switch transistor 507d of the output driving unit 507 are turned on. Accordingly, only a single driving unit 507 drives the output pad DOUT in response to the first and second output signals DOKP and DOKN. Finally, when the control signals MRS1–MRS4 are set to (0,0,0,0), no output drive capability is provided.

To address this limitation of the driver of FIG. 5 when the control signals MRS1–MRS4 are set to (0,0,0,0), an additional driving unit can be added which is not responsive to the control signals. In particular, the programmable output driver circuit 405 of FIG. 6 includes an additional driving unit 609 which is responsive to the first and second output signals DOKP and DOKN and provides output drive capability even if the control signals MRS1–MRS4 are set to (0,0,0,0).

Figure 6:
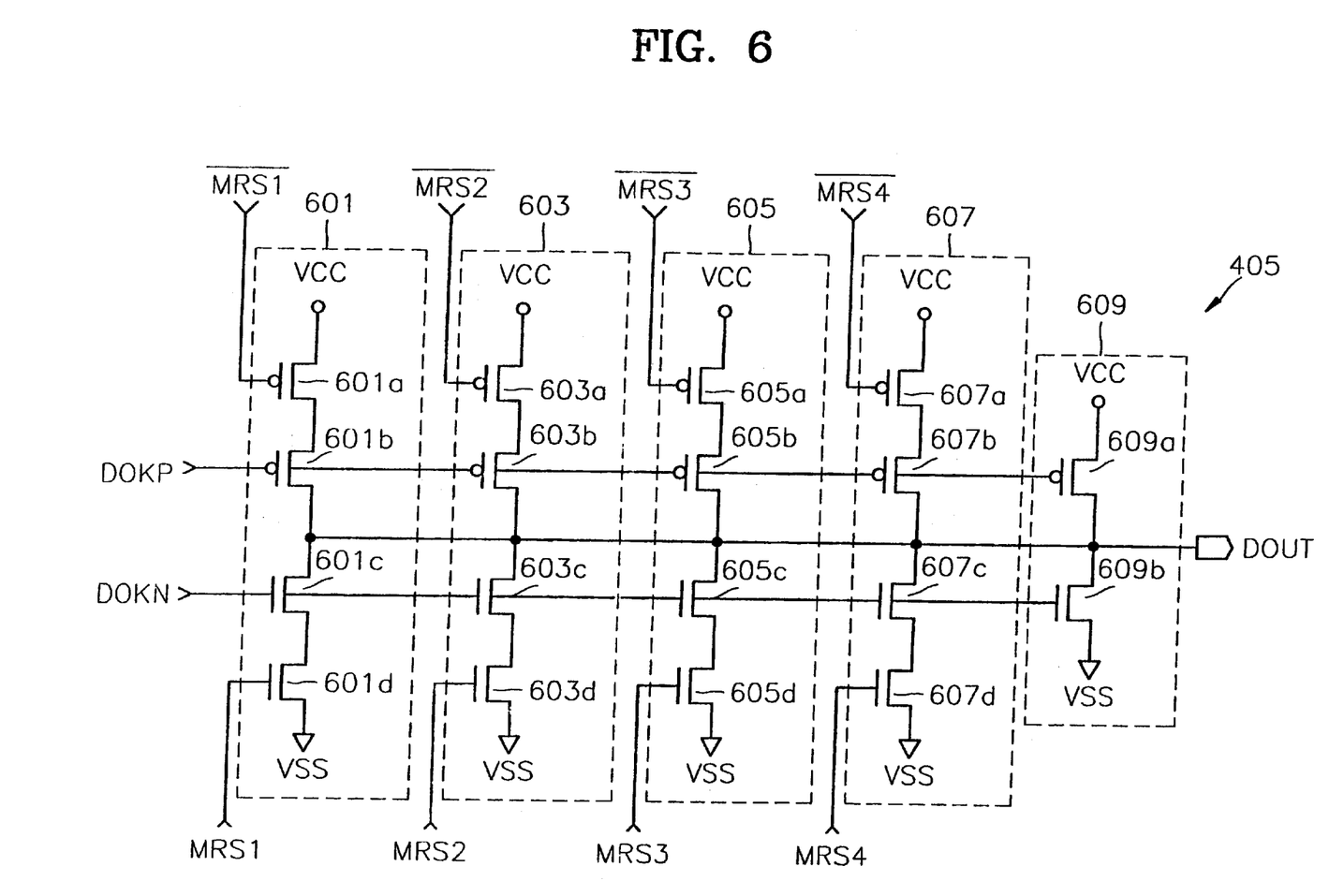
FIG. 6 is an electrical schematic of the programmable output driver of FIG. 4, according to a second embodiment of the present invention.

Referring specifically to FIG. 6, the programmable output driver circuit 405 according to a second embodiment includes five output driving units 601, 603, 605, 607 and 609 for driving an output pad DOUT in response to first and second output signals DOKP and DOKN. Each of the output driving units 601, 603, 605 and 607 is independently controlled by corresponding control signals MRS1/$\overline{\text{MRS1}}$–MRS4/$\overline{\text{MRS4}}$. Each of the output driving units 601, 603, 605 and 607 includes: (i) PMOS switch transistors 601a, 603a, 605a and 607a (each of which has a source to which a power supply voltage VCC is applied and a gate to which a corresponding inverted control signal, one of $\overline{\text{MRS1}}$–$\overline{\text{MRS4}}$, is applied); (ii) PMOS pull-up transistors 601b, 603b, 605b and 607b (each of which has a source connected to a respective drain of a PMOS switch transistor, a gate to which the first output signal DOKP is applied and a drain connected to the pad DOUT); (iii) NMOS pull-down transistors 601c, 603c, 605c and 607c (each of which has a drain connected to the pad DOUT and a gate to which the second output signal DOKN is applied); and (iv) NMOS switch transistors 601d, 603d, 605d and 607d (each of which has a drain connected to source of a respective NMOS pull-down transistor, a gate to which a corresponding control signal, one of MRS1–MRS4, is applied and a source to which a ground voltage VSS is applied). Based on this configuration of driving units, the effective size of the output driver 405 can be controlled by selective turning on or off the PMOS switch transistors 601a, 603a, 605a and 607a (which are controlled by the inverted control signals $\overline{\text{MRS1}}$–$\overline{\text{MRS4}}$) and turning on or off the corresponding NMOS switch transistors 601d, 603d, 605d and 607d controlled by the control signals MRS1–MRS4. For example, when the control signals MRS1–MRS4 are set to (1,1,1,1), the PMOS switch transistors 601a, 603a, 605a and 607a and the NMOS switch transistors 601d, 603d, 605d and 607d of the output driving units 601, 603, 605 and 607 are all turned on. This means the driving units 601, 603, 605, 607 and 609 all drive the output pad DOUT in parallel in response to the first and second output signals DOKP and DOKN. However, when the control signals MRS1–MRS4 are set to (0,0,0,1), the PMOS switch transistors 601a, 603a and 605a and the NMOS switch transistors 601d, 603d and 605d of the output driving units 601, 603 and 605 are turned off, and the PMOS switch transistor 607a and the NMOS switch transistor 607d of the output driving unit 607 are turned on. Accordingly, only driving units 607 and 609 drive the output pad DOUT in response to the first and second output signals DOKP and DOKN. Alternative embodiments of the above described driver circuit 405 may also be provided. For example, NMOS transistors may be substituted for the PMOS transistors 601b, 603b, 605b, 607b and 609a of FIG. 6. In addition, if NMOS transistors are substituted for the PMOS transistors 601a, 603a, 605a and 607a of FIG. 6, the inverted control signals $\overline{\text{MRS1}}$–$\overline{\text{MRS4}}$ need not be generated.

Figure 7:
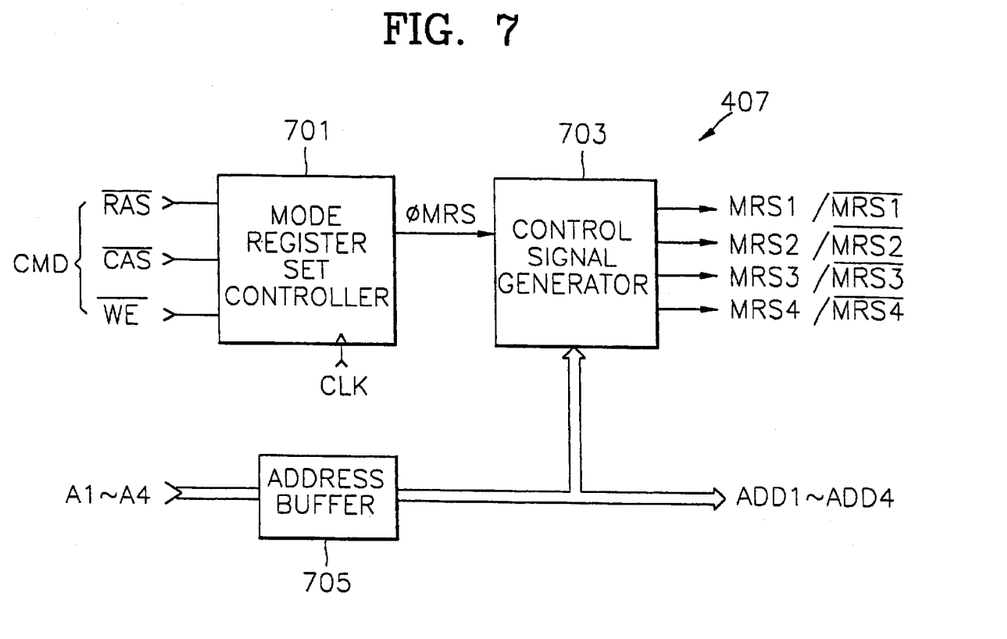
FIG. 7 is a block diagram of the controller of FIG. 4.
Figure 9:
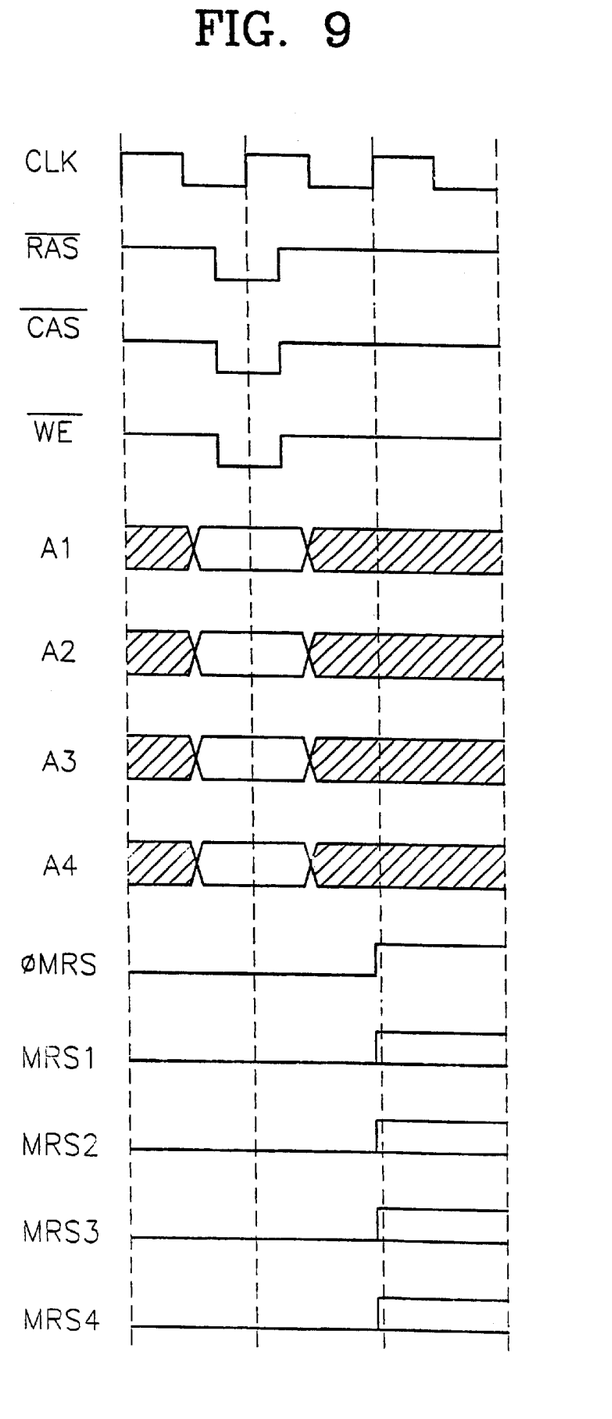
FIG. 9 is a timing diagram which illustrates operation of the controller of FIG. 7.

Referring now to FIGS. 7 and 9, the output driver controller 407 of FIG. 4 preferably includes a mode register set controller 701, a control signal generator 703 and an address buffer 705. The mode register set controller 701 receives a clock signal CLK and generates a mode control signal ΦMRS in response to command signals. These command signals include a row address strobe signal $\overline{\text{RAS}}$, a column address strobe signal $\overline{\text{CAS}}$ and a write enable signal $\overline{\text{WE}}$. The mode control signal φMRS is activated when the command signals are appropriately activated at the time the clock signal CLK transitions from 0→1. The control signal generator 703 generates the control signals MRS1–MRS4 and the inverted control signals $\overline{\text{MRS1}}$–$\overline{\text{MRS4}}$ in response to the mode control signal ΦMRS and buffered address signals ADD1–ADD4. As will be understood by those skilled in the art, the address buffer 705 buffers the external addresses A1–A4 which are applied.

Figure 8:
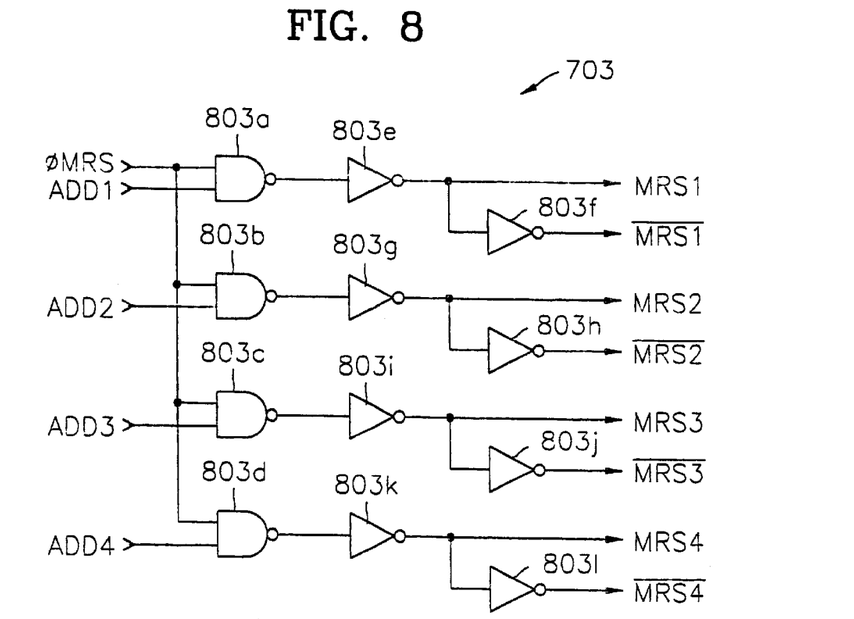
FIG. 8 is an electrical schematic of an embodiment of the control signal generator of FIG. 7.

Referring to FIGS. 8 and 9, the control signal generator 703 of FIG. 7 may include NAND gates 803a–803d and inverters 803c–803l, and reproduces each bit of the addresses ADD1–ADD4 as the control signals MRS1–MRS4 when the mode control signal φMRS is active. Whenever the mode control signal is inactive (i.e., at a logic 0 potential), the control signals MRS1–MRS4 are set to logic 0 potentials and the inverted control signals $\overline{\text{MRS1}}$–$\overline{\text{MRS4}}$ are set to logic 1 potentials which turn off the output driver circuit 405.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A semiconductor memory device, comprising:
    a memory cell array having a plurality of memory cells;
    a data output buffer coupled to the memory cell array;
    a programmable output driver circuit, said programmable output driver circuit comprising:
        first and second control signal lines;
        a first pull-up/pull-down driver circuit, said first pull-up/pull-down driver circuit having first and second data inputs, a first control signal input electrically coupled to said first control signal line, a first complementary control signal input and an output;
        a second pull-up/pull-down driver circuit, said second pull-up/pull-down driver circuit having first and second data inputs electrically coupled to the first and second data inputs of said first pull-up/pull-down driver circuit, respectively, a second control signal input electrically coupled to said second control signal line, a second complementary control signal input and an output electrically coupled to the output of said first pull-up/pull-down driver circuit; and
        means, responsive to an address and at least one command signal selected from the group consisting of a row address strobe signal, a column address strobe signal and a write enable signal, for generating a first control signal on the first control signal line and a second control signal on the second control signal line.

2. The memory device of claim 1, wherein said driver circuit further comprises first and second complementary control signals lines; wherein the first complementary control signal input of said first pull-up/pull-down driver circuit is electrically coupled to said first complementary control signal line; and wherein the second complementary control signal input of said second pull-up/pull-down driver circuit is electrically coupled to said second complementary control signal line.

3. The memory device of claim 2, wherein said first and second pull-up/pull-down driver circuits each comprise first and second PMOS transistors and first and second NMOS transistors.

4. The memory device of claim 3, wherein the first and second NMOS transistors of said first pull-up/pull-down driver circuit have respective gate electrodes which correspond to the first data input and the first control signal input, respectively; and wherein the first and second PMOS transistors of said first pull-up/pull-down driver circuit have respective gate electrodes which correspond to the second data input and the first complementary control signal input, respectively.

5. The memory circuit of claim 1, wherein said first pull-up/pull-down driver circuit comprises four MOS transistors of the same type electrically connected in series between first and second supply signal lines.

6. The memory device of claim 4, wherein said driver circuit further comprises a third pull-up/pull-down driver circuit having first and second data inputs electrically coupled to the first and second data inputs of said first pull-up/pull-down driver circuit, respectively.

7. The memory device of claim 6, wherein outputs of said first, second and third pull-up/pull-down driver circuits are electrically coupled together; and wherein said third pull-up/pull-down driver circuit comprises only a single pair of MOS transistors.

8. The memory device of claim 7, wherein said generating means is responsive to a plurality of command signals and an address and comprises means for generating a first pair of complementary control signals on the first control signal line and first complementary control signal line and a second pair of complementary control signals on the second control signal line and second complementary control signal line; and wherein said third pull-up/pull-down driver circuit is not responsive to said generating means.

9. An integrated circuit memory device, comprising:
a memory cell array electrically coupled to a pair of differential data lines;
an output buffer having first and second inputs electrically coupled to the pair of differential data lines;
a plurality of control signal lines;
a programmable output driver having first and second data inputs electrically coupled to at least one output of said output buffer and a plurality of control inputs electrically coupled to said plurality of control signal lines; and
a mode control signal generator that generates a plurality of control signals on the plurality of control signal lines, in response to a plurality of addresses and command signals including a row address strobe signal, a column address strobe signal and a write enable signal.

10. The memory device of claim 9, wherein said programmable output driver comprises first, second and third pull-up/pull-down driver circuits having outputs electrically coupled together.

11. The memory device of claim 10, wherein each of the first, second and third pull-up/pull-down driver circuits has a pair of inputs electrically coupled to the first and second data inputs.

12. The memory device of claim 11, wherein each of the first, second and third pull-up/pull-down driver circuits comprises a pair of PMOS transistors and a pair of NMOS transistors.

13. The memory device of claim 12, wherein one of the NMOS transistors in the first pull-up/pull-down driver circuit has a gate electrode electrically coupled to one of a first pair of differential control signal lines; and wherein one of the PMOS transistors in the first pull-up/pull-down driver circuit has a gate electrode electrically coupled to another of the first pair of differential control signal lines.

14. A semiconductor memory device, comprising:
a memory cell array having a plurality of memory cells;
a data output buffer coupled to the memory cell array;
a mode control signal generator that generates a first control signal on the first control signal line and a second control signal line, in response to a command signal and an address; and
a programmable output driver circuit coupled to the data output buffer, said programmable output driver circuit comprising:
a first pull-up/pull-down driver circuit, said first pull-up/pull-down driver circuit having a data input, a control signal input responsive to the first control signal and an output; and
a second pull-up/pull-down driver circuit, said second pull-up/pull-down driver circuit having a data input electrically coupled to the data input of said first pull-up/pull-down driver circuit, a control signal input responsive to the second control signal and an output electrically coupled to the output of said first pull-up/pull-down driver circuit;
wherein said mode control signal generator generates a mode control signal in response to a plurality of command signals;
wherein the first and second control signals are disabled when the mode control signal is inactive; and
wherein the first and second control signals match the address when the mode control signal is active.

15. The memory device of claim 14, wherein said mode control signal generator generates a mode control signal in response to a plurality of command signals.

16. The memory device of claim 14, wherein the first and second control signals are disabled when the mode control signal is inactive; and wherein the first and second control signals match the address when the mode control signal is active.

17. The memory device of claim 14, wherein said driver circuit further comprises a third pull-up/pull-down driver circuit having a data input electrically coupled to the data input of said first pull-up/pull-down driver circuit.

18. The memory device of claim 17, wherein said third pull-up/pull-down driver circuit is not responsive to signals generated by said mode control signal generator.

19. A semiconductor memory device, comprising:
a memory cell array having a plurality of memory cells;
a data output buffer coupled to the memory cell array;
a mode register set signal generator that generates a mode control signal in response to command signals including a row address strobe signal, a column address strobe signal and a write enable signal;
a control signal generator that generates a first mode signal and a second mode signal in response to the mode control signal and a plurality of addresses;
a programmable output driver circuit coupled to the data output buffer, said programmable output driver circuit comprising:
a first pull-up/pull-down driver circuit, said first pull-up/pull-down driver circuit having a first data input, a first mode signal input responsive to the first mode signal and an output; and
a second pull-up/pull-down driver circuit, said second pull-up/pull-down driver circuit having a first data input electrically coupled to the data input of said first pull-up/pull-down driver circuit, a second mode signal input responsive to the second mode signal and an output electrically coupled to the output of said first pull-up/pull-down driver circuit.

* * * * *